(12) United States Patent
Hawes et al.

(10) Patent No.: US 10,599,642 B1
(45) Date of Patent: Mar. 24, 2020

(54) DATA AGGREGATION PROCESS

(71) Applicant: Cadence Design Systems, Inc., San Jose, CA (US)

(72) Inventors: Christopher James Hawes, Carlisle, MA (US); Edward Howard Utzig, Princeton, MA (US); Richard George Meitzler, Ashburnham, MA (US); Ynon Cohen, Kfar Saba (IL); Douglas Jay Koslow, Boxborough, MA (US)

(73) Assignee: Cadence Design Systems, Inc., San Jose, CA (US)

( * ) Notice: Subject to any disclaimer, the term of this patent is extended or adjusted under 35 U.S.C. 154(b) by 354 days.

(21) Appl. No.: 14/734,612

(22) Filed: Jun. 9, 2015

(51) Int. Cl.
*G06F 16/242* (2019.01)
*G06F 11/36* (2006.01)
*G06F 9/455* (2018.01)

(52) U.S. Cl.
CPC ........ *G06F 16/244* (2019.01); *G06F 9/45504* (2013.01); *G06F 11/3608* (2013.01)

(58) Field of Classification Search
None
See application file for complete search history.

(56) References Cited

U.S. PATENT DOCUMENTS

| 2006/0020580 | A1* | 1/2006 | Dettinger | G06F 17/30595 |
| 2008/0162500 | A1* | 7/2008 | Dettinger | G06F 17/30864 |
| 2011/0125772 | A1* | 5/2011 | Ah-Soon | G06F 17/30525 |
| | | | | 707/759 |
| 2013/0091488 | A1* | 4/2013 | Koutyrine | G06F 8/77 |
| | | | | 717/120 |

OTHER PUBLICATIONS

"Plug-in", Computer Desktop Encyclopedia, The Computer Language Company, Inc., retrieved Oct. 5, 2018 from https://www.computerlanguage.com/results.php?definition=plug-in (Year: 2018).*
"Platform", Computer Desktop Encyclopedia, The Computer Language Company, Inc., retrieved Oct. 5, 2018 from https://www.computerlanguage.com/results.php?definition=platform (Year: 2018).*

* cited by examiner

*Primary Examiner* — Alex Gofman
*Assistant Examiner* — Umar Mian
(74) *Attorney, Agent, or Firm* — Mark H. Whittenberger, Esq.; Holland & Knight LLP

(57) ABSTRACT

The present disclosure relates to a system and method for linking GUI plug-ins with multiple data providers. Embodiments may include allowing, via one or more computing devices, at least one data provider access to a data abstraction layer. Embodiments may further include allowing at least one GUI plug-in access to the data abstraction layer and receiving, at the data abstraction layer, a query from the at least one GUI plug-in. In response to the query, embodiments may include retrieving one or more data sets from the at least one data provider and aggregating a subset of the one or more data sets from the at least one data provider. Embodiments may further include providing the subset of the one or more data sets to the at least one GUI plug-in.

17 Claims, 5 Drawing Sheets

DATA AGGREGATION PROCESS

FIELD OF THE INVENTION

The present disclosure relates to electronic design automation (EDA), and more specifically, to a method for debugging in an electronic design.

DISCUSSION OF THE RELATED ART

EDA utilizes software tools that may be used in the design and analysis of numerous electronic systems such as printed circuit boards (PCBs) and integrated circuits (ICs). Some EDA tools include debugging platforms, however, existing tools do not have a mechanism for aggregating data from multiple providers for debugging. This often results in time consuming projects that yield error prone and substandard code as well as difficult team collaboration issues.

SUMMARY OF INVENTION

In one or more embodiments of the present disclosure, a computer-implemented method for linking GUI plug-ins with multiple data providers is provided. The method may include allowing, via one or more computing devices, at least one data provider access to a data abstraction layer. The method may further include allowing at least one GUI plug-in access to the data abstraction layer and receiving, at the data abstraction layer, a query from the at least one GUI plug-in. In response to the query, the method may include retrieving one or more data sets from the at least one data provider and aggregating a subset of the one or more data sets from the at least one data provider. The method may further include providing the subset of the one or more data sets to the at least one GUI plug-in.

One or more of the following features may be included. In some embodiments, aggregating may include selecting an object having a highest priority as indicated by the at least one GUI plug-in. Aggregating may also include reconciling two or more logically identical objects. The data abstraction layer may act as a switching mechanism configured to process multiple data types. The data abstraction layer may act as a switching mechanism configured to process multiple query format types. Each of the at least one GUI plug-ins may access the data abstraction layer via an assigned query delegate. The assigned query delegate may be configured to receive at least one of a query object specifying a desired type of data and a set of parameters specifying one or more constraints for a query result set.

In some embodiments, a computer-readable storage medium for electronic design simulation is provided. The computer-readable storage medium may have stored thereon instructions that when executed by a machine result in one or more operations. Operations may include allowing, via one or more computing devices, at least one data provider access to a data abstraction layer. Operations may further include allowing at least one GUI plug-in access to the data abstraction layer and receiving, at the data abstraction layer, a query from the at least one GUI plug-in. In response to the query, operations may include retrieving one or more data sets from the at least one data provider and aggregating a subset of the one or more data sets from the at least one data provider. Operations may further include providing the subset of the one or more data sets to the at least one GUI plug-in.

One or more of the following features may be included. In some embodiments, aggregating may include selecting an object having a highest priority as indicated by the at least one GUI plug-in. Aggregating may also include reconciling two or more logically identical objects. The data abstraction layer may act as a switching mechanism configured to process multiple data types. The data abstraction layer may act as a switching mechanism configured to process multiple query format types. Each of the at least one GUI plug-ins may access the data abstraction layer via an assigned query delegate. The assigned query delegate may be configured to receive at least one of a query object specifying a desired type of data and a set of parameters specifying one or more constraints for a query result set.

In one or more embodiments of the present disclosure, a system may include a computing device having at least one processor configured to allow at least one data provider access to a data abstraction layer. The at least one processor may be further configured to allow at least one GUI plug-in access to the data abstraction layer. The at least one processor may be configured to receive, at the data abstraction layer, a query from the at least one GUI plug-in and in response to the query, retrieve one or more data sets from the at least one data provider. The at least one processor may be further configured to aggregate a subset of the one or more data sets from the at least one data provider and to provide the subset of the one or more data sets to the at least one GUI plug-in.

One or more of the following features may be included. In some embodiments, aggregating may include selecting an object having a highest priority as indicated by the at least one GUI plug-in. Aggregating may also include reconciling two or more logically identical objects. The data abstraction layer may act as a switching mechanism configured to process multiple data types. The data abstraction layer may act as a switching mechanism configured to process multiple query format types. Each of the at least one GUI plug-ins may access the data abstraction layer via an assigned query delegate. The assigned query delegate may be configured to receive at least one of a desired type of data and a set of parameters specifying one or more constraints for a query result set.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Figure 1:
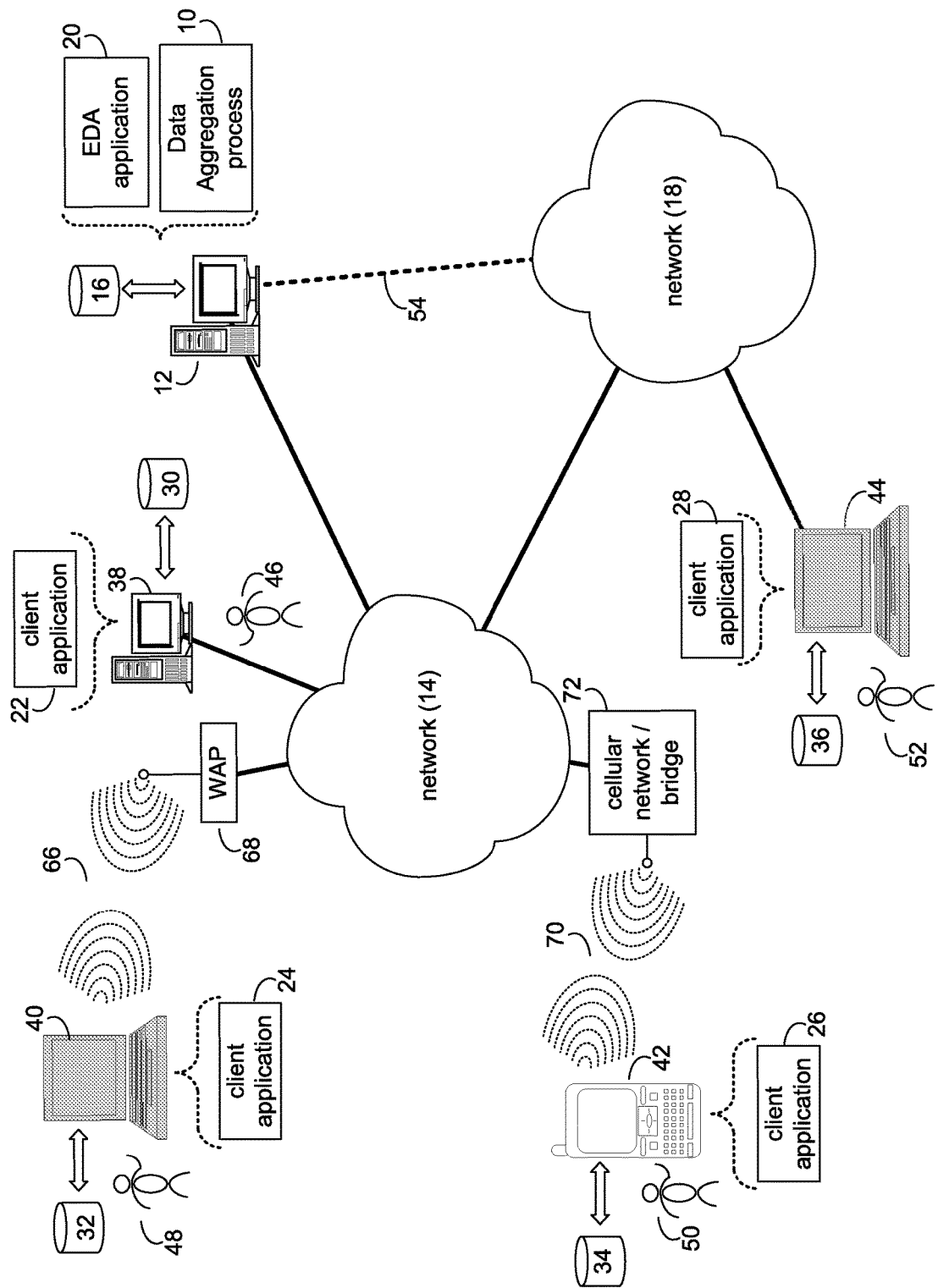
FIG. 1 is a system diagram depicting aspects of the data aggregation process in accordance with an embodiment of the present disclosure.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

The phrase "GUI Plugin" as used herein may refer to a software object or set of objects that provide functionality for displaying data retrieved from a Data Provider in a Graphical User Interface component. The phrase "Query Delegate" as used herein may refer to a software object that serves as a liaison between a Gui Plugin and a Data Abstraction Layer, serving queries from the Gui Plugin and returning data from the Data Abstraction layer. The phrase "Data Abstraction Layer" as used herein may refer to a software object or set of objects that includes algorithms for receiving queries from Query Delegates, and returning sets of aggregated data from one or more Data Providers. The phrase "Data Provider" as used herein software object or set of objects that controls a set of data, which it can provide to a Data Abstraction Layer in response to queries. The term "QueryKind" as used herein may refer to a software object that describes a specific set of data, including the type of that data. The term "QueryParameterSet" as used herein may refer to a software object that contains a set of parameters, representing a set of constraints on the set of data represented by a QueryKind. The phrase "Object of Type T" as used herein may refer to a software object in a typed programming language that is of a specific type T. The phrase "Aggregated Object of Type T" as used herein may refer to a software object in a typed programming language that is of a specific type T, and is formed by an Aggregator using an algorithm to unify two or more Objects of Type T. The term "Aggregator" as used herein may refer to a software object that contains one or more algorithms for combining two software objects into a single software object.

Various debugging tools, such as those available from the Assignee of the subject application, may provide a platform that allows for internal teams, as well as external third parties, to contribute data for debugging. This data from multiple providers may be aggregated and presented to the user via GUI plugins associated with the tool, which may also be supplied by third parties, in a unified manner. GUI plugins and data providers should not need to have any knowledge of how many data providers or GUI plugins there are or what data they provide.

For example, multiple data providers may wish to contribute data to a single design hierarchy, which a design browser GUI plugin may want to present to the user. Additionally and/or alternatively, they may wish to make their design searchable through the tool search mechanisms that multiple GUI plugins utilize, returning results alongside results from other data providers.

Accordingly, GUI plugins must be able to query for data via some mechanism, and must be given in return a set of data that has been intelligently aggregated from all of the available data providers. Data aggregation is a subset of this problem. In this way, it is likely that different data providers may provide the same logical objects in some cases. Therefore an algorithm must be used to decide which data provider's objects should be returned in these cases. This algorithm must be made customizable on a query-by-query basis, since GUI plugins may differ in exactly how they want to display the data. Some plugins may want to display all results from all data providers, while others may prefer to have the algorithm choose only one of a set of conflicting objects to display.

Referring to FIG. 1, there is shown data aggregation process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, the data aggregation process may reside on and be executed, in whole or in part, by a client electronic device, such as a personal computer, notebook computer, personal digital assistant, or the like.

The instruction sets and subroutines of data aggregation process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for report generation. EDA application 20 may be referred to herein as a design tool.

Data aggregation process 10 may be a stand alone application, or may be an applet/application/script that may interact with and/or be executed within EDA application 20. In addition/as an alternative to being a server-side process, the data aggregation process may be a client-side process (not shown) that may reside on a client electronic device (described below) and may interact with an EDA client application (e.g., one or more of EDA client applications 22, 24, 26, 28). Further, the data aggregation process may be a hybrid server-side/client-side process that may interact with EDA application 20 and an EDA client application (e.g., one or more of client applications 22, 24, 26, 28). As such, the data aggregation process may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize data aggregation process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.).

Figure 2:
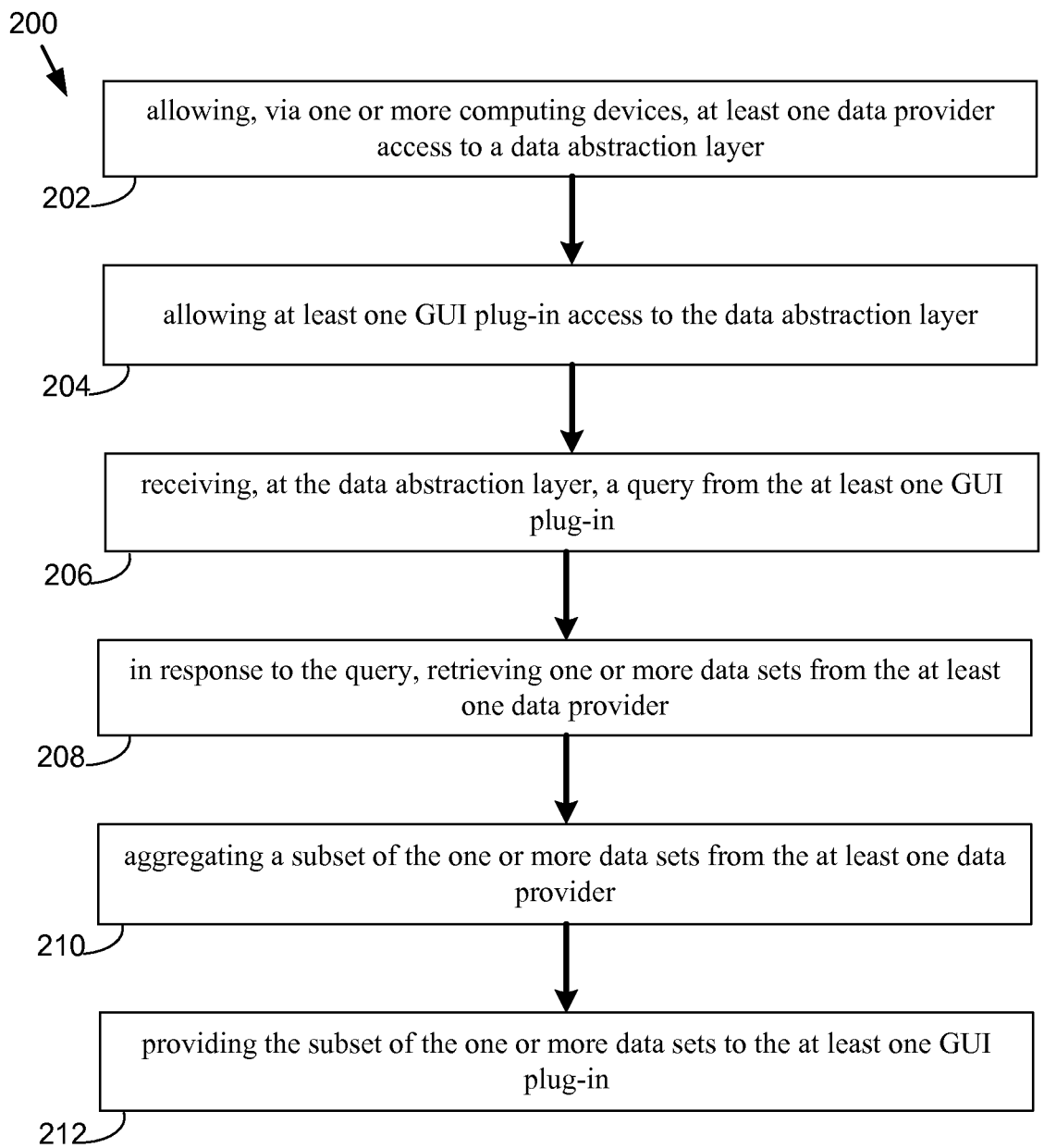
FIG. 2 is a flowchart depicting operations consistent with the data aggregation process of the present disclosure.

Referring now to FIG. 2, embodiments of data aggregation process 10 may include allowing (202), via one or more computing devices, at least one data provider access to a data abstraction layer. Embodiments may further include allowing (204) at least one GUI plug-in access to the data abstraction layer and receiving (206), at the data abstraction layer, a query from the at least one GUI plug-in. In response to the query, embodiments may include retrieving (208) one or more data sets from the at least one data provider and aggregating (210) a subset of the one or more data sets from the at least one data provider. Embodiments may further include providing (212) the subset of the one or more data sets to the at least one GUI plug-in.

Figure 3:
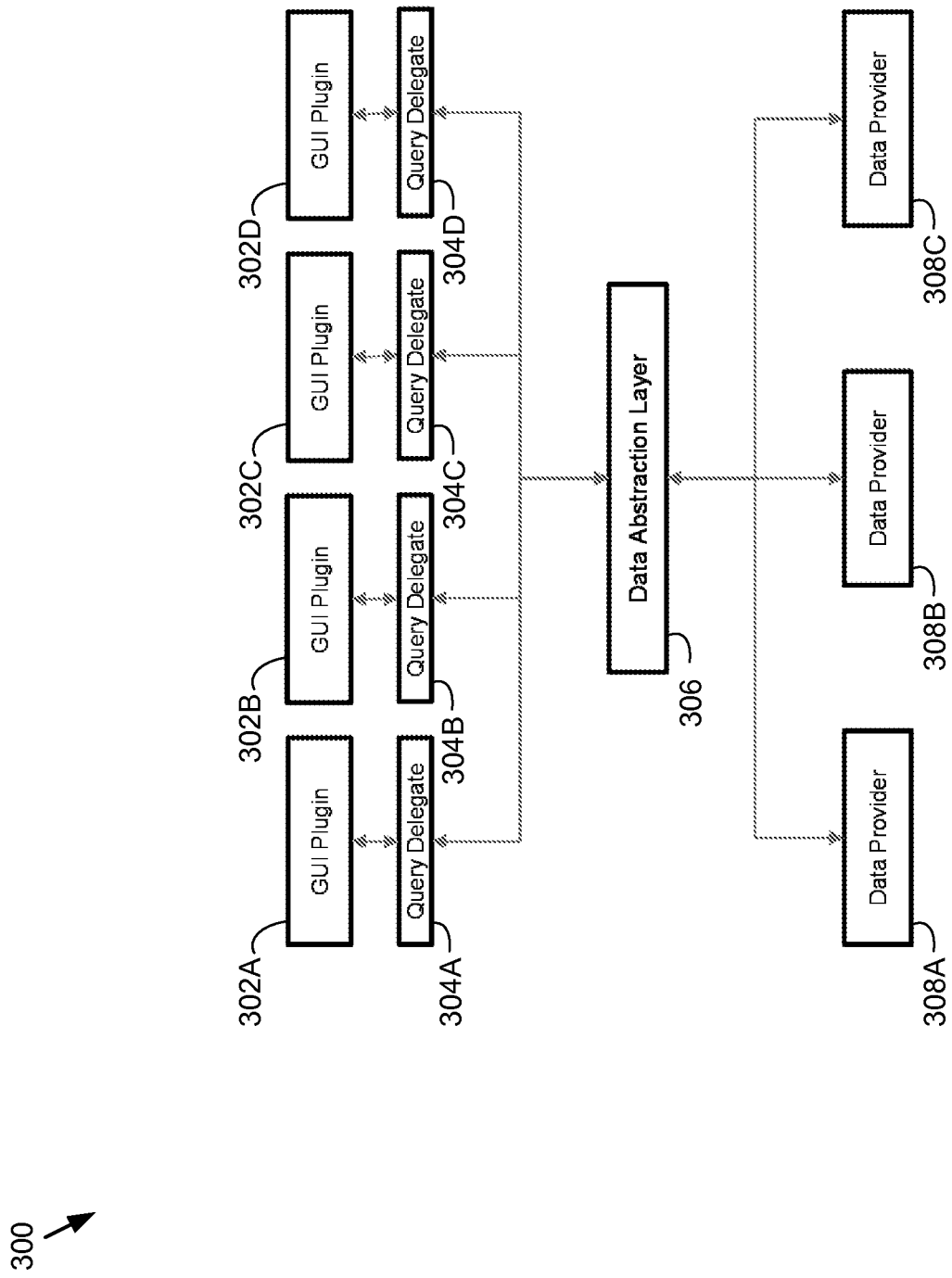
FIG. 3 is a schematic depicting aspects of the data aggregation process in accordance with an embodiment of the present disclosure.
Figure 4:
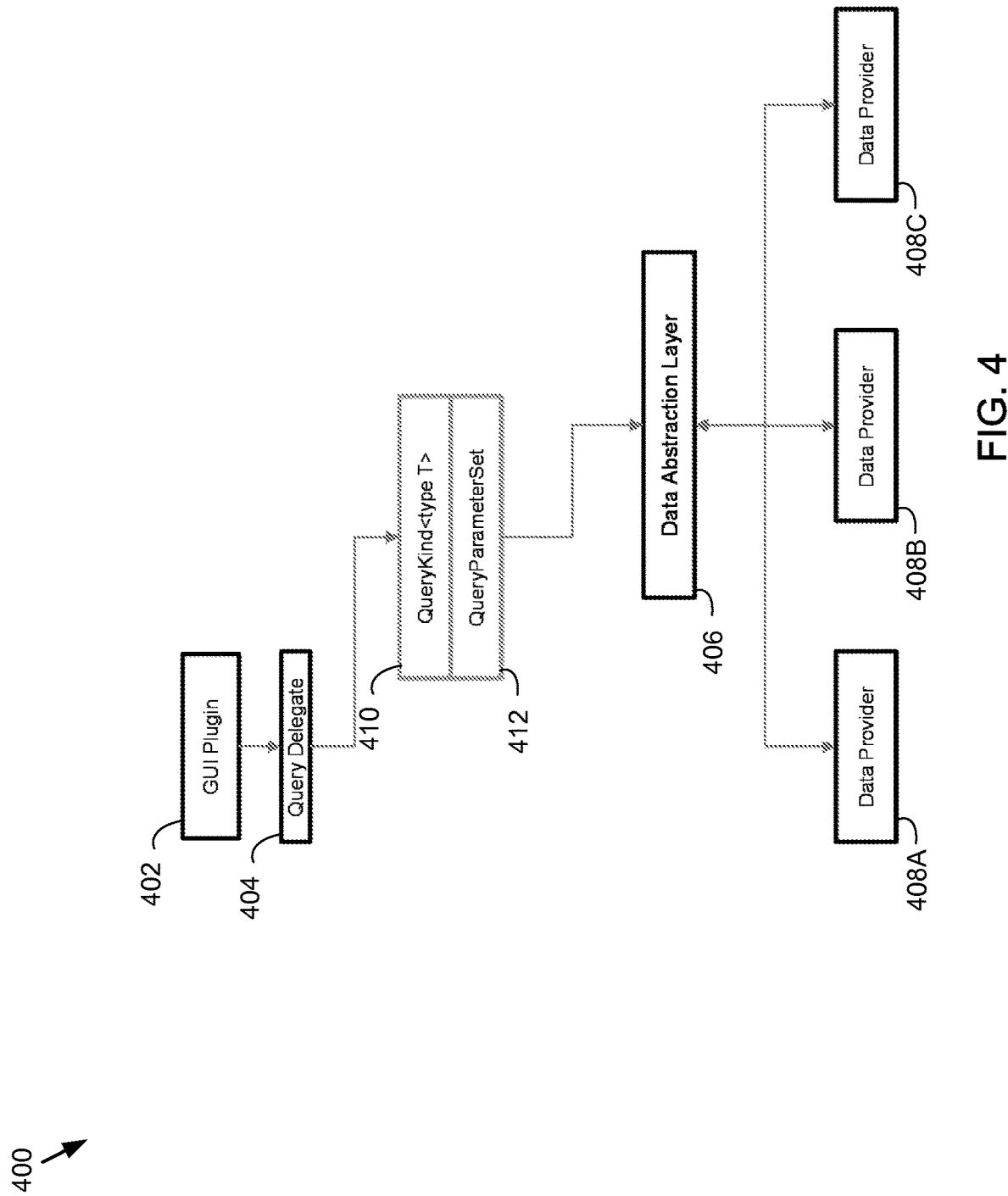
FIG. 4 is a schematic depicting aspects of the data aggregation process in accordance with an embodiment of the present disclosure.
Figure 5:
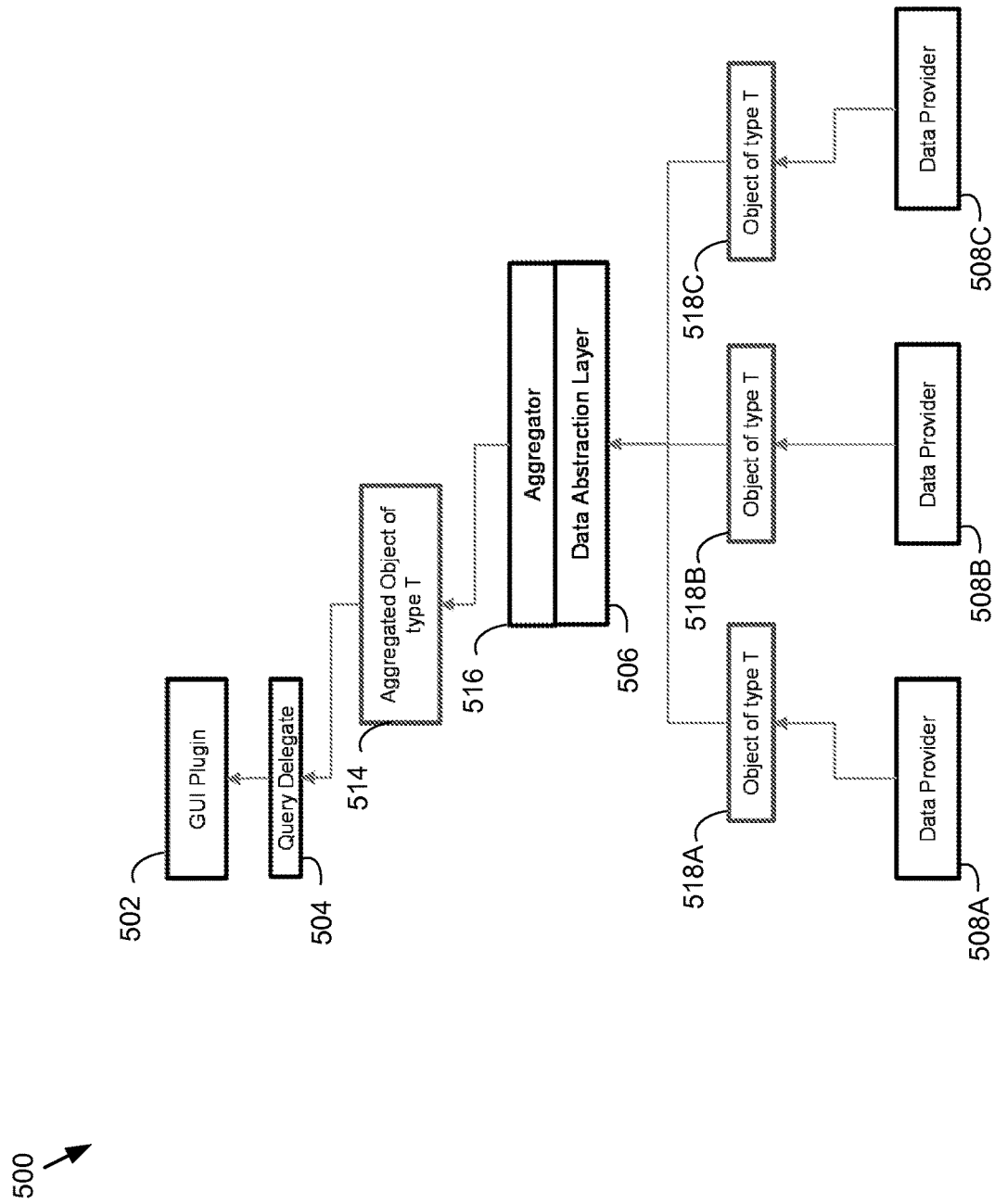
FIG. 5 is a schematic depicting aspects of the data aggregation process in accordance with an embodiment of the present disclosure.

Referring also to FIGS. 3-5, embodiments consistent with data aggregation process 10 are provided. FIG. 3 depicts a diagram of a high-level architecture associated with an embodiment of data aggregation process 10. Data aggregation process 10 may include one or more GUI plug-ins 302 and query delegates 304 that may communicate with data providers 308 via data abstraction layer ("DAL") 306. Accordingly, data aggregation process 10 may allow one or more data providers to plug-in to access an EDA tool such as EDA application 20 shown in FIG. 1 and to implement a set of queries, and as a result be automatically included in the debug display associated with EDA application 20.

In some embodiments, and as shown in FIG. 3, data providers 308 and GUI Plugins 304 may be picked up at runtime by plugging in to DAL 306 using various interfaces and services (e.g. Java). This set of interfaces and services, as well as the high-level architecture of the solution, may be made public so that third parties may contribute their data to debug sessions.

In some embodiments, DAL 306 may allow any number of GUI plugins (e.g. GUI plug-ins 302A-302D) to plugin to DAL 306 by consuming its DataQueryProvider interface, and any number of data providers may plugin by implementing the DataProvider interface for DAL 306 to consume. In order to make queries, a GUI plugin may also implement a DataConsumer interface and register with DAL 306.

In some embodiments, upon consuming the DataQueryProvider interface, each instance of the DataConsumer interface may register itself as such via the interface and may be provided a QueryDelegate object. It is through this delegate object that they make queries and interact with DAL 306.

In some embodiments, and as shown in the query request diagram of FIG. 4, in order to perform a query, a GUI plugin 402 may call its QueryDelegate 304 with two pieces of information. First, a QueryKind object 410, which represents the kind of data that GUI plugin 402 is attempting to obtain. The set of QueryKinds available may be provided by DAL 306. In some embodiments, third parties may also create their own QueryKind objects and register them with DAL 306 to create custom queries.

In some embodiments, QueryKind object 410 may include a generic type parameter which specifies the return type of this query. Accordingly, queries may be constructed that return any data type. For example, some queries might return an integer, while others might return a list of objects.

An example of a QueryKind might be a CHILDREN query which may return a list of objects corresponding to the children of a specific object in a design hierarchy. Additionally and/or alternatively, another example might be a CHILDREN SIZE query, which may return an integer representing the number of children of a specific hierarchical object. These are provided merely by way of example as numerous additional embodiments are also within the scope of the present disclosure.

Additionally and/or alternatively, in order to perform a query, GUI plugin 402 may call its QueryDelegate 404 with a QueryParameterSet object 412, which may represent a set of parameters to be passed to the query to specify constraints for the query results. Each QueryKind may require a specific set of parameters, and may also support some optional parameters.

In the CHILDREN example above, the query might require an OBJECT parameter to specify which object's children should be returned, and may also include optional parameters such as TYPE, to narrow down the types of children that should be returned.

Upon receiving a query from a QueryDelegate object, DAL 406 may begin the process of gathering data from the available Data Providers 408A-408C. The algorithm used to achieve this may vary and may be customized on a per-QueryKind basis. In some embodiments, DAL 406 may utilize a system of QueryHandler objects to implement queries. For example, each QueryKind 410 that may be registered may be required to have a matching QueryHandler to do the work of accumulating data from data providers 408A-408C.

In some embodiments, data may be retrieved from DataProviders 408A-408C by DAL 406 using a similar mechanism, and using the same QueryKinds. However, unlike DAL 406, a data provider may not be required to implement every QueryKind. In the event that a data provider is queried for a QueryKind that it does not support, it may return a null reference, in which case DAL 406 may ignore it for this query. Once DAL 406 has accumulated results from all data providers 408A-408C, the results may be aggregated and returned to the user as is shown in the query response diagram of FIG. 5. This may be achieved using an instance of DataAggregator 516. Each instance of DataAggregator 516 may include an encapsulation of an aggregation algorithm.

In some embodiments, DataAggregator 516 may be configured to take a list of lists of objects, and convert that into a single list of objects. This has some subtleties. For example, it may be possible for two or more data providers 508A-508C to provide the same logical object in their results list, and the aggregator 516 may then make a decision as to which object(s) to include in its result set.

In some embodiments, it may not actually be necessary that the things being aggregated are lists. For example, it is possible that the objects being aggregated are not lists at all, but are single objects. In that case, the aggregator may combine the multiple objects into a single object to be returned, using its own logic and algorithms. This may, for example, involve choosing one of the objects to return (e.g., based on priority or some other logic), or it may involve forming a new object which has properties of all of the multiple objects.

In some embodiments, GUI plugins (e.g. GUI plug-in 502) may customize the aggregation algorithm that they wish to have used for their queries by supplying a DataAggregator 516 instance to their QueryDelegate 504. In this way, any queries made thereafter may use the specified DataAggregator 516. This may be a pre-built aggregator that DAL 506 provides, or a custom implemented aggregator that a third party provides.

In some embodiments, DAL 506 may include a plurality of aggregation algorithms, each of which addresses the above situation differently. For example, a "merge" algorithm may be configured so that when two or more logically equivalent objects are provided, choose only the object with the highest priority in the GUI plugin's DataProviderList as is described in further detail hereinbelow. Additionally and/or alternatively, if using a "union" algorithm, when two or more logically equivalent objects are provided, return all objects. It should be noted that embodiments of the subject application may be customizable, and as such, there may be many additional and/or alternative ways of aggregating (e.g. other than selecting the highest priority) depending on what the implementer needs.

As discussed above, plugin authors may implement their own custom DataAggregators by implementing the DataAggregator interface, and then supplying the resulting object to a GUI plugin's QueryDelegate 504. Finally, once aggregation has been performed, the result may be returned to GUI plugin 502, and the query lifecycle is complete.

In some embodiments, DataProviders 508A-508C may come and go during runtime and may be bound and unbound to DAL 506 whenever this happens. Accordingly, at each point when a DataProvider 508A-508C is bound or unbound, each GUI plugin's QueryDelegate 504 may call through the plugin's DataConsumer interface to alert it of the change. With this call, the newly updated list of DataProviders may be provided to the plugin, encapsulated in a DataProviderList object. This object is, logically, a prioritized list of Data Providers that the plugin can modify, reordering and/or removing Data Providers to suit its needs. The priority of Data Providers can affect how some aggregation algorithms operate, as discussed above.

In some embodiments, aggregating may include reconciling and/or combining two or more logically identical objects. Accordingly, there may be numerous ways two or more logically same objects could be dealt with, for example, one aggregator might choose to include just one of the objects in the resulting set of data, another might choose to include all of the objects, and yet another might choose to combine them in some way into a single unified object.

Embodiments of data aggregation process 10 may only require third parties and internal teams to simply implement a set of Java interfaces, insert their compiled code (e.g., .jar file) in the correct place, and their data may be automatically shown in the EDA tool or application. No access to proprietary source code is required in order to add API calls.

Additionally and/or alternatively, since the aggregation algorithms may be customizable, GUI plugins have a high degree of flexibility in choosing how they want the data for their display.

In some embodiments, EDA application 20 may support a variety of languages and/or standards. Some of these may include, but are not limited to, IEEE-standard languages, the Open Verification Methodology (OVM), the emerging Accellera Universal Verification Methodology (UVM), and the e Reuse Methodology (eRM). EDA application 20 may support e, Open Verification Library (OVL), OVM class library, emerging UVM class library, SystemC®, SystemC Verification Library, SystemVerilog, Verilog®, VHDL, PSL, SVA, CPF, as well as numerous other languages. EDA application 20 may be used in accordance with mixed-language, mixed-signal, and low-power designs, across multiple levels of abstraction, and may include the ability to "hot swap" the RTL simulation in/out of numerous accelerators/emulators.

As used in any embodiment described herein, the terms "circuit" and "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof. Embodiments of the present disclosure may be incorporated in whole or in part into any design tools.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations of the present disclosure may be written in an object oriented programming language such as Java, Smalltalk, or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method comprising:
displaying, at a graphical user interface ("GUI"), an electronic design automation debugging platform having a plurality of GUI plug-ins, wherein each of the plurality of GUI plug-ins is configured to access the electronic design automation debugging platform and be automatically included in a debugging display associated with an electronic design automation application;
allowing, via one or more computing devices, at least one data provider access to a data abstraction layer;
allowing the plurality of GUI plug-ins access to the data abstraction layer, wherein allowing the plurality of GUI plug-ins access to the data abstraction layer includes registering the plurality of GUI-plugins with the data abstraction layer at runtime and assigning a separate query delegate of a plurality of query delegates to each GUI plug-in of the plurality of GUI plug-ins, wherein each GUI plug-in of the plurality of GUI plug-ins is configured to access the data abstraction layer via the assigned query delegate;
receiving, at the data abstraction layer, a query and a data aggregator instance from at least one GUI plug-in of the plurality of GUI plug-ins, wherein the data aggregator instance defines how data is aggregated for the at least on GUI plug-in;
in response to the query, retrieving one or more data sets from the at least one data provider;
aggregating a subset of the one or more data sets from the at least one data provider, wherein the at least one data provider is configured to provide a null reference in response to a query not supported by the at least one data provider and the data abstraction layer is configured to ignore the null reference when aggregating the subset of the one or more data sets from the at least one data provider;
providing the subset of the one or more data sets to the at least one GUI plug-in; and
debugging, using the at least one GUI plug-in, an electronic design.

2. The computer-implemented method of claim 1, wherein aggregating includes selecting an object having a highest priority as indicated by the at least one GUI plug-in.

3. The computer-implemented method of claim 1, wherein aggregating includes reconciling two or more logically identical objects.

4. The computer-implemented method of claim 1, wherein the data abstraction layer acts as a switching mechanism configured to process multiple data types.

5. The computer-implemented method of claim 1, wherein the data abstraction layer acts as a switching mechanism configured to process multiple query format types.

6. The computer-implemented method of claim 1, wherein the assigned query delegate is configured to receive at least one of a query object specifying a desired type of data and a set of parameters specifying one or more constraints for a query result set.

7. A non-transitory computer-readable storage medium having stored thereon instructions that when executed by a machine result in the following operations:
displaying, at a graphical user interface ("GUI"), an electronic design automation debugging platform having a plurality of GUI plug-ins, wherein each of the plurality of GUI plug-ins is configured to access the electronic design automation debugging platform and be automatically included in a debugging display associated with an electronic design automation application;
allowing, via one or more computing devices, at least one data provider access to a data abstraction layer;
allowing the plurality of GUI plug-ins access to the data abstraction layer, wherein allowing the plurality of GUI plug-ins access to the data abstraction layer includes registering the plurality of GUI-plugins with the data abstraction layer at runtime and assigning a separate query delegate of a plurality of query delegates to each GUI plug-in of the plurality of GUI plug-ins, wherein each GUI plug-in of the plurality of GUI plug-ins is configured to access the data abstraction layer via the assigned query delegate;
receiving, at the data abstraction layer, a query and a data aggregator instance from at least one GUI plug-in of the plurality of GUI plug-ins, wherein the data aggregator instance defines how data is aggregated for the at least on GUI plug-in;
in response to the query, retrieving one or more data sets from the at least one data provider;
aggregating a subset of the one or more data sets from the at least one data provider wherein the at least one data provider is configured to provide a null reference in response to a query not supported by the at least one data provider and the data abstraction layer is configured to ignore the null reference when aggregating the subset of the one or more data sets from the at least one data provider;
providing the subset of the one or more data sets to the at least one GUI plug-in; and
debugging, using the at least one GUI plug-in, an electronic design.

8. The computer-readable storage medium of claim 7, wherein aggregating includes selecting an object having a highest priority as indicated by the at least one GUI plug-in.

9. The computer-readable storage medium of claim 7, wherein aggregating includes reconciling two or more logically identical objects.

10. The computer-readable storage medium of claim 7, wherein the data abstraction layer acts as a switching mechanism configured to process multiple data types.

11. The computer-readable storage medium of claim 7, wherein the data abstraction layer acts as a switching mechanism configured to process multiple query format types.

12. The computer-readable storage medium of claim 7, wherein the assigned query delegate is configured to receive at least one of a query object specifying a desired type of data and a set of parameters specifying one or more constraints for a query result set.

13. A system for debugging an electronic circuit design prior to fabrication comprising:
a computing device having at least one processor coupled to a memory, wherein the at least one processor is configured to display, at a graphical user interface ("GUI"), an electronic design automation debugging platform having a plurality of GUI plug-ins, wherein each of the plurality of GUI plug-ins is configured to access the electronic design automation debugging platform and be automatically included in a debugging display associated with an electronic design automation application, the at least one processor further configured to allow at least one data provider access to a data abstraction layer, the at least one processor further configured to allow the plurality of GUI plug-ins access to the data abstraction layer, wherein allowing the plurality of GUI plug-ins access to the data abstraction layer includes registering the plurality of GUI-plugins with the data abstraction layer at runtime and assigning a separate query delegate of a plurality of query delegates to each GUI plug-in of the plurality of GUI plug-ins, wherein each GUI plug-in of the plurality of GUI plug-ins is configured to access the data abstraction layer via the assigned query delegate, the at least one processor configured to receive, at the data abstraction layer, a query and a data aggregator instance from at least one GUI plug-in of the plurality of GUI plug-ins, wherein the data aggregator instance defines how data is aggregated for the at least on GUI plug-in, retrieve one or more data sets from the at least one data provider, the at least one processor further configured to aggregate a subset of the one or more data sets from the at least one data provider, wherein the at least one data provider is configured to provide a null reference in response to a query not supported by the at least one data provider and the data abstraction layer is configured to ignore the null reference when aggregating the subset of the one or more data sets from the at least one data provider, the at least one processor configured to provide the subset of the one or more data sets to the at least one GUI plug-in, the at least one processor further configured to allow for debugging, using the at least one GUI plug-in, of an electronic design.

14. The system of claim 13, wherein aggregating includes selecting an object having a highest priority as indicated by the at least one GUI plug-in.

15. The system of claim 13, wherein aggregating includes reconciling two or more logically identical objects.

16. The system of claim 13, wherein the data abstraction layer acts as a switching mechanism configured to process multiple data types.

17. The system of claim 13, wherein the data abstraction layer acts as a switching mechanism configured to process multiple query format types.

* * * * *